US012224773B2

(12) United States Patent
de Haas et al.

(10) Patent No.: US 12,224,773 B2
(45) Date of Patent: Feb. 11, 2025

(54) CIRCUITRY FOR ENCODING A BUS SIGNAL AND ASSOCIATED METHODS

(71) Applicant: NXP B.V., San Jose, CA (US)

(72) Inventors: Clemens Gerhardus Johannes de Haas, Ewijk (NL); Rigor Hendrikus Lambertus van der Heijden, Nijmegen (NL)

(73) Assignee: NXP B.V., Eindhoven (NL)

( * ) Notice: Subject to any disclaimer, the term of this patent is extended or adjusted under 35 U.S.C. 154(b) by 236 days.

(21) Appl. No.: 18/055,288

(22) Filed: Nov. 14, 2022

(65) Prior Publication Data

US 2023/0179225 A1    Jun. 8, 2023

(30) Foreign Application Priority Data

Dec. 6, 2021   (EP) .................................... 21212543

(51) Int. Cl.
*H03M 7/12*   (2006.01)
*H03M 5/12*   (2006.01)
*H04L 12/40*  (2006.01)

(52) U.S. Cl.
CPC ............. *H03M 5/12* (2013.01); *H04L 12/40* (2013.01)

(58) Field of Classification Search
CPC ...... H03M 5/12; H04L 12/40; H04L 25/4902; H04L 25/493; H04L 25/4904; H03K 5/156; H03K 5/04
USPC .......................................................... 341/70
See application file for complete search history.

(56) References Cited

U.S. PATENT DOCUMENTS

| 3,159,840 | A | * | 12/1964 | Woo ................. G11B 20/10194 |
| | | | | 360/44 |
| 3,675,133 | A | | 7/1972 | Frankeny et al. |
| 4,063,070 | A | * | 12/1977 | Delarue ............. G11B 20/1403 |
| 4,920,429 | A | * | 4/1990 | Jaffe ..................... H04N 23/73 |
| | | | | 348/E5.037 |

FOREIGN PATENT DOCUMENTS

| EP | 2498460 A1 | | 9/2012 |
| WO | 2006/045342 | * | 5/2006 |

OTHER PUBLICATIONS

Murugesan, S.; "Pulse-Delay Circuit Has Dual-Edge Trigger"; E.D.N. Electrical Design News, vol. 32, No. 5; p. 186 (Mar. 4, 1987).
U.S. Appl. No. 17/489,362; not yet published; 32 pages (Sep. 29, 2021).

* cited by examiner

*Primary Examiner* — Jean B Jeanglaude

(57) ABSTRACT

An apparatus comprising an encoder is configured to:
  detect a first edge in the input signal and, in response, provide a pulse generation sequence comprising the encoder being configured to:
  generate, in the output signal, a first pulse, wherein the first pulse is provided over first and second minimum time periods irrespective of an edge subsequent the first edge being present in the input signal; and
  obtain a first sample of the input signal; and
  obtain a second sample at an end of the first pulse; and
  if the first sample and the second sample are indicative of different voltage levels, generate a second pulse; or
  if the first and second sample and the same maintain the voltage level in the output signal.

20 Claims, 5 Drawing Sheets

CIRCUITRY FOR ENCODING A BUS SIGNAL AND ASSOCIATED METHODS

CROSS-REFERENCE TO RELATED APPLICATIONS

This application claims the priority under 35 U.S.C. § 119 of European patent application no. 21212543.9, filed Dec. 6, 2021 the contents of which are incorporated by reference herein.

TECHNICAL FIELD

The present disclosure relates to circuitry for use with a transceiver configured to receive one or more signals from a bus and provide a representation of those one or more signals to a controller. The present disclosure also relates to the circuitry being configured to encode said one or more signals in a way to mitigate against jitter. In particular, it relates to circuitry which may form part of a transceiver for an Ethernet based network, such as a 10BASE-T1S or 10BASE-T1L transceiver. It also relates to a combination of a microcontroller and a transceiver and associated methods for encoding a signal.

BACKGROUND

A transceiver may be configured to receive one or more signals from a bus comprising changes in bus voltage levels. The transceiver may be configured to generate a receive signal based on the voltage levels received on the bus compared to one or more thresholds. Jitter in the one or more signals from the bus can make generation of the receive signal challenging, particularly when the receive signal is expected to meet one or more standards.

SUMMARY

According to a first aspect of the present disclosure there is provided an apparatus comprising an input terminal for receiving an input signal indicative of signalling from a network, the input signal comprising at least a two level signal that comprises either a first voltage level or a second voltage level; an encoder configured to encode the input signal into an output signal; and an output terminal for outputting the output signal.

The encoder is configured to detect a first edge in the input signal and, in response to the detection of the first edge, provide a pulse generation sequence. Providing the pulse generation sequence comprises the encoder being configured to: generate, in the output signal, a first pulse, the first pulse comprising a first ramp portion in which the voltage level is changed from a first-pulse level to a second-pulse level; a first hold portion in which the second-pulse level is maintained; a second ramp portion in which the voltage level is changed from the second-pulse level to the first-pulse level; and a second hold portion in which the first-pulse level is maintained.

The first ramp portion and the first hold portion are provided at least over a first predetermined minimum time period and the second ramp portion and the second hold portion are provided at least over a second predetermined minimum time period. The first pulse is provided over the first and second minimum time periods irrespective of an edge subsequent the first edge being present in the input signal.

Providing the pulse generation sequence further comprises the encoder being configured to sample the input signal to obtain a first sample indicative of a voltage level of the input signal to which the input signal transitions following said detection of the first edge and store said first sample; and sample the input signal a second time within a time window between the end of the first hold portion and an end of the first pulse to obtain a second sample indicative of a voltage level of the input signal and store said second sample.

If the first sample and the second sample are indicative of different voltage levels, then the encoder is configured to generate, in the output signal, a second pulse, the second pulse comprising a first ramp portion in which the voltage level is changed from the first-pulse level to the second-pulse level, a first hold portion in which the second-pulse level is maintained, a second ramp portion in which the voltage level is changed from the second-pulse level to the first-pulse level and a second hold portion in which the first-pulse level is maintained, and wherein the first ramp portion and the first hold portion are provided at least over a third predetermined minimum time period and wherein the second ramp portion and the second hold portion are provided at least over a fourth predetermined minimum time period. Alternatively, if the first sample and the second sample are indicative of the same voltage levels, then the encoder is configured to maintain the voltage level in the output signal at the first-pulse level.

In one or more examples, the apparatus is for use with a 10BASE-T1S transceiver, as proposed and defined in IEEE 802.3cg project (Clause 147).

In one or more embodiments, the input signal is encoded with Differential Manchester Encoding.

In one or more embodiments, the encoder is configured to maintain the voltage level in the output signal at the first-pulse level in response to the first sample and the second sample being indicative of the same voltage levels, until the encoder detects a second edge in the input signal.

In one or more embodiments, the encoder is configured to detect a second edge in the input signal that follows said second pulse or that follows the maintenance of the voltage level in the output signal at the first-pulse level; and, in response to the detection of the second edge, provide said pulse generation sequence.

In one or more embodiments, the sum of the first and second predetermined minimum time periods is equal to the sum of the third and fourth predetermined minimum time periods.

In one or more embodiments, one or both of: the first predetermined minimum time period is equal to the second predetermined minimum time period; and the third predetermined minimum time period is equal to the fourth predetermined minimum time period.

In one or more embodiments, one or both of: the sum of the first and second predetermined minimum time periods; and the sum of the third and fourth predetermined minimum time periods; is greater than a quarter of the bit time of the input signal.

In one or more embodiments, the second sample of the input signal at the second time is within a time window between half a bit time of the input signal after the detection of the first edge and the end of the first pulse.

In one or more embodiments, said network comprises an Ethernet network and said apparatus comprises part of a transceiver for coupling to said Ethernet network.

In one or more embodiments, the transceiver comprises an Ethernet 10BASE-T1S transceiver.

In one or more embodiments, the encoder comprises a first flipflop configured to detect rising edges in said input signal and a second flipflop configured to detect falling edges in said input signal, wherein in response to detection of either of a rising edge or a falling edge, one of the respective first and second flipflops is configured to provide for initiation of said pulse generation sequence and, while said pulse generation sequence is ongoing, provide a signal to the other of the first and second flipflop modules to inhibit initiation of a further pulse generation sequence.

In one or more embodiments, the pulse generation sequence is provided by a predetermined sequence of signalling output by a respective finite state machine which is configured to be triggered by a respective one of said first flipflop and said second flipflop.

In one or more embodiments, one or both of: the sum of the first and second predetermined minimum time periods; and the sum of the third and fourth predetermined minimum time periods; is equal to or less than half a bit time of the input signal.

In one or more embodiments, one or both of: the sum of the first and second predetermined minimum time periods; and the sum of the third and fourth predetermined minimum time periods; is greater than 16 ns.

According to a second aspect of the present disclosure there is provided a combination of a transceiver and a digital part, wherein the transceiver is configured to couple to a network to receive differential signalling from the network and generate an input signal comprising a difference between the parts of the differential signalling, wherein the transceiver includes the apparatus of the first aspect and receives the input signal and generates the output signal, wherein said digital part is configured to receive said output signal and includes a decoder configured to decode the output signal to provide a bitstream for an Ethernet physical layer module of the digital part indicative of the voltage levels in the input signal.

According to a third aspect of the present disclosure there is provided a method for encoding an input signal into an output signal, wherein the input signal is indicative of signalling from a network and comprises at least a two-level signal that comprises either a first voltage level or a second voltage level. The method comprises an encoder detecting a first edge in the input signal; and, in response to the detection of the first edge, providing a pulse generation sequence.

Providing the pulse generation sequence comprises generating, in the output signal: a first pulse, the first pulse comprising a first ramp portion in which the voltage level is changed from a first-pulse level to a second-pulse level; a first hold portion in which the second-pulse level is maintained; a second ramp portion in which the voltage level is changed from the second-pulse level to the first-pulse level; and a second hold portion in which the first-pulse level is maintained.

The first ramp portion and the first hold portion are provided at least over a first predetermined minimum time period and wherein the second ramp portion and the second hold portion are provided at least over a second predetermined minimum time period, and wherein the first pulse is provided over the first and second minimum time periods irrespective of an edge subsequent the first edge being present in the input signal.

Providing the pulse generation sequence further comprises sampling the input signal to obtain a first sample indicative of a voltage level of the input signal to which the input signal transitions following said detection of the first edge and store said first sample; and sampling the input signal a second time within a time window between the end of the first hold portion and an end of the first pulse to obtain a second sample indicative of a voltage level of the input signal and store said second sample.

If the first sample and the second sample are indicative of different voltage levels, then generating, in the output signal, a second pulse, the second pulse comprising a first ramp portion in which the voltage level is changed from the first-pulse level to the second-pulse level, a first hold portion in which the second-pulse level is maintained, a second ramp portion in which the voltage level is changed from the second-pulse level to the first-pulse level and a second hold portion in which the first-pulse level is maintained, and wherein the first ramp portion and the first hold portion are provided at least over a third predetermined minimum time period and wherein the second ramp portion and the second hold portion are provided at least over a fourth predetermined minimum time period. Alternatively, if the first sample and the second sample are indicative of the same voltage levels, then maintaining the voltage level in the output signal at the first-pulse level.

According to a fourth aspect of the present disclosure there is provided a computer readable medium or computer program configured to perform the method of the third aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

While much of the focus in recent Ethernet development has centred on high data rates, not every application requires speeds of up to 400 Gbps. For some applications, including Internet of Things (IoT), industrial and automotive, 10 Mbps is sufficient. Factors like cost, weight, distance and the space required for cable are more important for these use cases.

Recognizing these evolving requirements, IEEE began work in early 2017 to define IEEE 802.3cg, a standard for single-pair Ethernet that supports 10 Mbps. The goals of IEEE 802.3cg were to define a point-to-point and a multi-drop short-distance standard with a maximum length of 25 meters, and a long-distance point-to-point standard that supports distances up to 1,000 meters. The resulting IEEE 802.3cg specification includes two link-layer standards: 10BASE-T1S and 10BASE-T1L.

The 10BASE-T1S short-range standard is primarily targeted at automotive and industrial applications. Multiple nodes on the network can share a cable in half-duplex shared-medium mode (multidrop mode) using the standard Ethernet Carrier-Sense Multiple Access with Collision Detection (CSMA/CD) access method or operate using PHY-Level Collision Avoidance (PLCA). The cable is an unshielded twisted pair (UTP) that may have multiple medium dependent interfaces (MDIs) attached thereto. As such, 10BASE-T1S may also be referred to as Multidrop Single Pair Ethernet (MSPE).

The 10BASE-T1L long-range option is designed for IoT and industrial control applications. The 1,000-meter range is sufficient for use in large factories or warehouses, and 10 Mbps is sufficient for gathering data from sensors and to monitor and control many types of industrial machinery. It shares the advantages of the short network variant: compatibility with four-pair Ethernet and lower cost, weight and required space.

The following description relates to the 10BASE-T1S standard but may be also applicable to other (including future) Ethernet standards and is therefore not necessarily limited to 10BASE-T1S.

Figure 1:
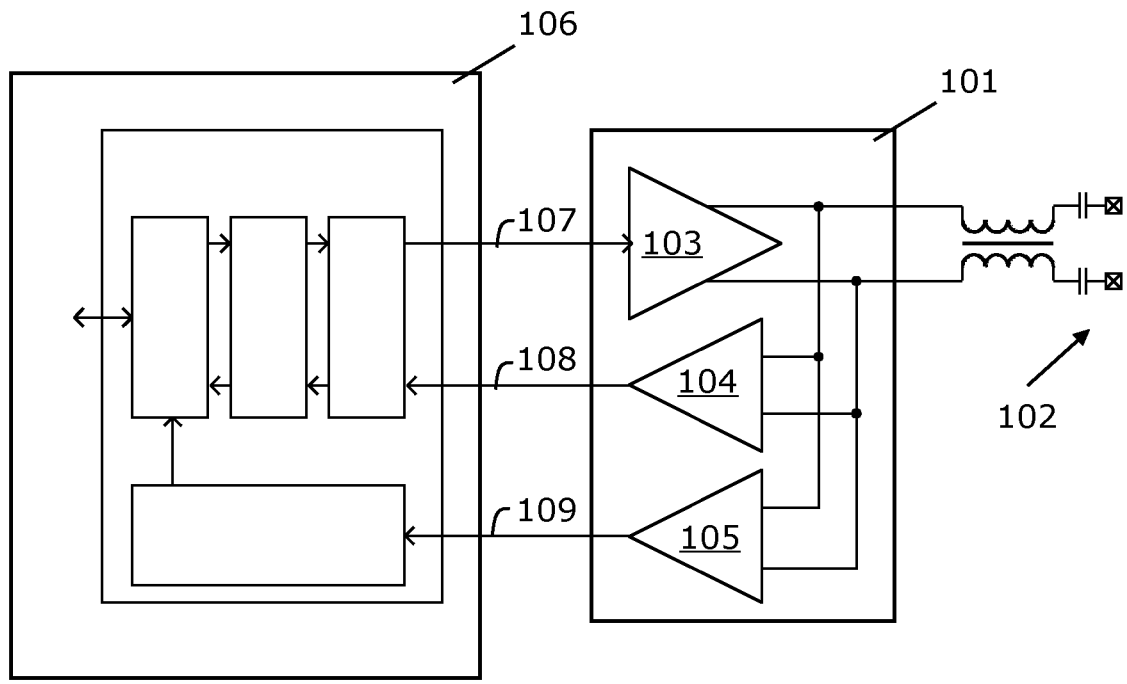
FIG. 1 shows an example Ethernet transceiver.

FIG. 1 shows one example of an Ethernet transceiver 101 connected to a signal line or bus 102. The signal line 102 comprises positive (LINE+) and negative (LINE−) lines formed as an unshielded twisted pair suitable for conveying differential voltage signals, and the Ethernet transceiver 101 comprises a corresponding pair of signal terminal configured for connection to the respective lines of the UTP.

The Ethernet transceiver 101 further comprises a transmitter module 103 for processing outgoing (egress) data into a suitable signal form for transmission to other nodes on the Ethernet network, a receiver module 104 for processing incoming signals from other nodes on the Ethernet network into a suitable data form for the higher layers of the protocol stack, and an energy detection module 105 for detecting activity on the signal line 102 from other nodes on the Ethernet network.

In this example, an Ethernet Physical Layer (PHY) is split into a digital, first part 106 and an analog frontend part. The digital, first part 106 typically comprises the components of the PHY that operate in the digital domain and may comprise at least part of a Ethernet Microcontroller, MCU, or Ethernet Switch. The transceiver 101 shown in FIG. 1 is the analog front end part and, in this example, is configured to interface with the digital PHY part 106 using three lines or pins: a transmit pin, TX, 107 for conveying outgoing data from the digital PHY part 106 to the transmission module 103 of the transceiver; a receive pin, RX, 108 for conveying incoming (ingress) data from the receiver module 104 of the transceiver to the digital PHY part 106; and an energy detection pin, ED, 109 for conveying activity detected by the energy detection module 105 to the digital PHY part 106.

Figure 2:
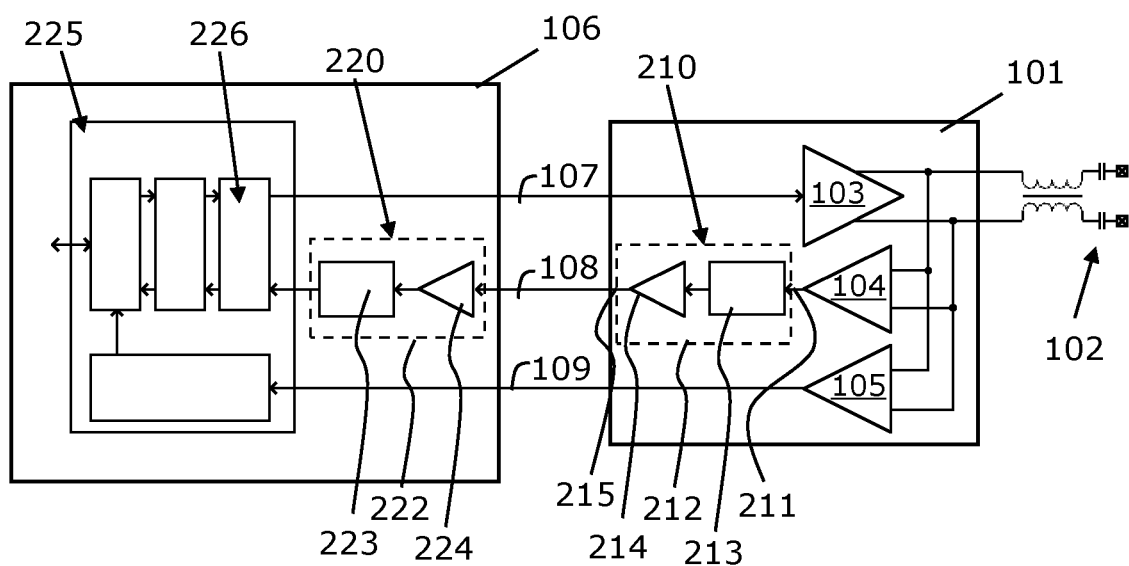
FIG. 2 shows an example embodiment of an Ethernet transceiver including an apparatus comprising an encoder, and an example embodiment of a decoder in a digital PHY part.

FIG. 2 shows the digital PHY part 106 and the transceiver 101, similar to FIG. 1. In this and one or more other examples, the transceiver 101 includes an apparatus 210 to provide for encoding of the Differential Manchester Encoded signal received from the receiver module 104.

The apparatus 210 comprises an input terminal 211 for receiving an input signal indicative of signalling from the network 102. The input terminal 211, in one or more examples, couples to the output of a receiver module 104, which may comprise a comparator configured to determine a difference between the voltage levels on each of the positive and negative lines of the signal line or bus 102.

The apparatus 210 further comprises an encoder 212 configured to encode the input signal into an output signal. In this and one or more other examples, the encoder 212 is embodied as an encoding logic module 213 and an amplifier 214 which may act as a signal driver. The apparatus 210 further comprises an output terminal 215 for outputting the output signal. The output terminal 215 may couple to the receive, RX, pin 108 for providing the digital PHY part 106 with the output signal, which is representative of the signalling received from the network.

The digital PHY part 106 may include a further apparatus 220 for decoding the signal received from the apparatus 210. Accordingly, the further apparatus 220 may comprise a decoder 222, which may comprise an input amplifier 224 and a decoding logic module 223. The further apparatus 220 may also have an input terminal to receive an the output signal of the apparatus 210 transmitted over the RX pin 108. An output terminal of the further apparatus 220 may be configured to provide a decoded output signal to the integrated physical layer module 225 or the Physical Medium Attachment sublayer 226 thereof.

Figure 3:
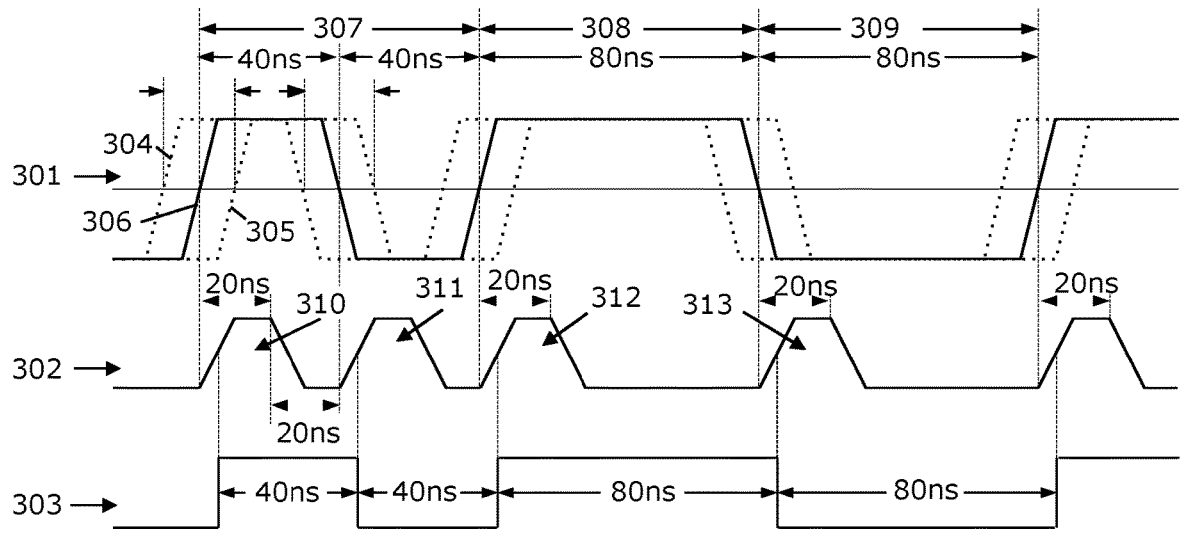
FIG. 3 shows an example timing diagram illustrating Return-to-Zero encoding of a Differential Manchester Encoded signal from an Ethernet network without network disturbance in the form of jitter.

FIG. 3 shows an example timing diagram illustrating Return-to-Zero encoding of a Differential Manchester Encoded signal from the Ethernet network without network disturbance in the form of jitter. The first graph 301 shows the difference between the positive (LINE+) and negative (LINE−) lines of the bus 102. Thus, the graph 301 may comprise the input of the receiver module 104, or the output of a comparator that determines the difference between the positive and negative lines of the bus.

A second graph 302 shows a Return-to-Zero encoded signal based on the output of the receiver module 104.

A third graph 303 shows a decoded form of the Return-to-Zero encoded signal as would be received at the integrated physical layer module 225 or the Physical Medium Attachment sublayer 226.

The first graph shows in dashed lines 304 and 305 the maximum jitter permitted according to the Ethernet standard. Accordingly, the dashed lines 304 and 305 illustrate how early or late the edge 306 may present while still being within the definition of a maximum permitted jitter. The first graph 301 illustrates the bus 102 presenting a logic one bit at 307, a logic zero bit at 308 and a further logic zero bit at 309.

In this example, the generation of each pulse 310, 311, 312, 313 in the Return-to-Zero encoded signal of graph 302 is triggered by the detection of an edge in the signal of the first graph 301.

Without any jitter, the decoded pulse widths in the third graph 303 are either 40 ns or 80 ns depending on a data one or data zero at 307, 308 and 309 in the first graph 301.

According to the proposed standard, the pulse widths shown in the third graph 303 can be a maximum of 20 ns high and can be a maximum of 20 ns low.

Figure 4:
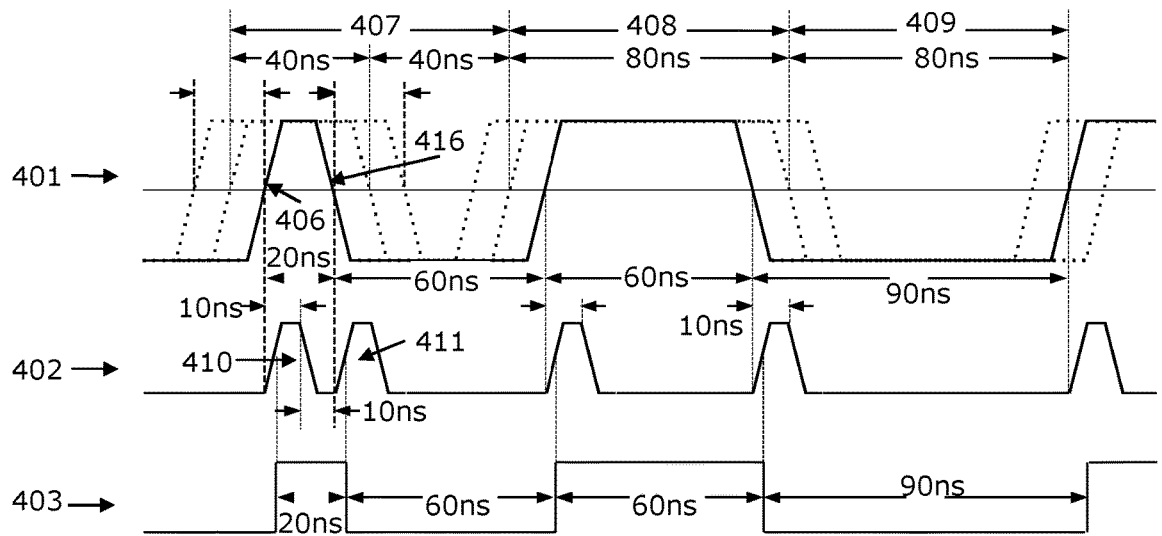
FIG. 4 shows an example timing diagram illustrating Return-to-Zero encoding of a Differential Manchester Encoded signal from the Ethernet network with network disturbance in the form of jitter and without the encoder of the one or more example embodiments.

FIG. 4 shows an example timing diagram illustrating Return-to-Zero encoding of a Differential Manchester Encoded signal from the Ethernet network but with network disturbance in the form of jitter. As before, the first graph 401 shows the difference between the positive (LINE+) and negative (LINE−) lines of the bus 102. Thus, the graph 401 may comprise the input of the receiver module 104, or the output of a comparator that determines the difference between the positive and negative lines of the bus.

A second graph 402 shows a Return-to-Zero encoded signal based on the output of the receiver module 104.

A third graph 403 shows a decoded form of the Return-to-Zero encoded signal as would be received at the integrated physical layer module 225 or the Physical Medium Attachment sublayer 226.

The first graph 401 shows the rising edge 406 of the signal received from the network signal line 102 received late by the maximum jitter constraint of 20 ns. Further, a falling edge 416 is received early by the maximum jitter constraint of 20 ns.

Considering the second graph 402, the first pulse 410 needs to be much shorter given that the falling edge 416 triggers the second pulse 411.

In this example of a worst-case jitter of 20 ns, the minimum time for pulse 410 is 20 ns. To ensure that in this minimum time of 20 ns the pulse 410 can be encoded as a return-to-zero pulse, the pulse 410 has a maximum pulse length of approximately 10 ns. The decoded signal shown in the third graph 403 then has the same jitter characteristic as the signal received from the signal line 102 shown in the first graph 401. In practice, this short pulse width to be provided in the Return-to-Zero encoded signal requires a relatively fast slope time (<<10 ns) to be able to decode reliably in the digital PHY part 106. However, these fast slope times result in a poor Electro Magnetic Emission (EME) performance.

Figure 5:
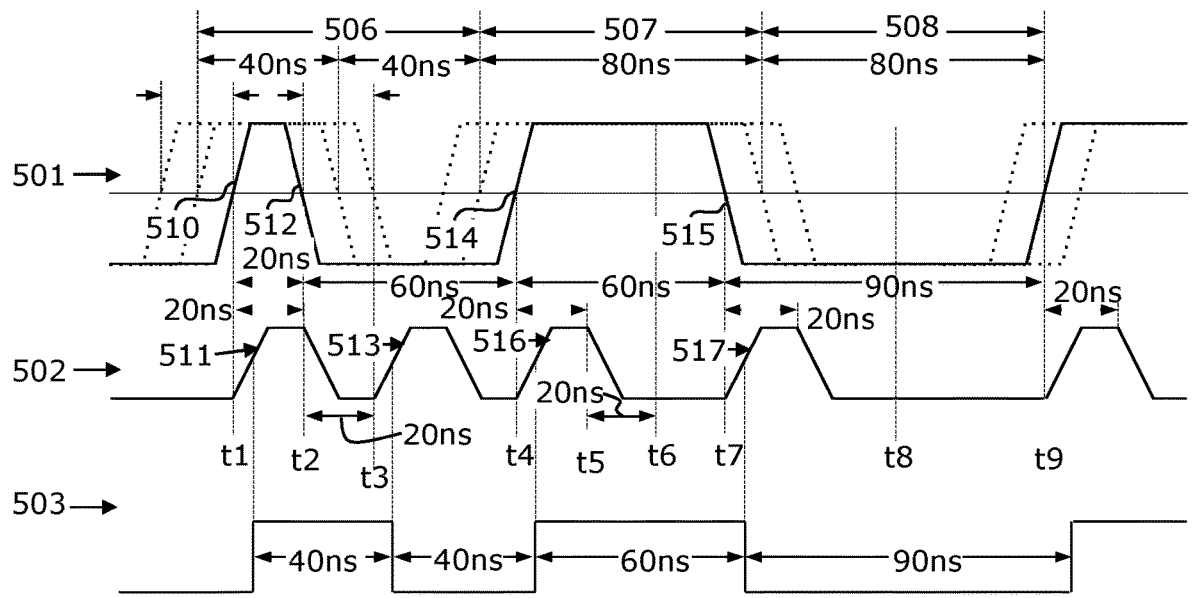
FIG. 5 shows an example timing diagram illustrating Return-to-Zero encoding by the encoder of example FIG. 2 of a Differential Manchester Encoded signal from the Ethernet network with network disturbance in the form of jitter.

FIG. 5 shows an example timing diagram illustrating Return-to-Zero encoding of a Differential Manchester Encoded signal from the Ethernet network performed by the example embodiment apparatus 210 of FIG. 2 and with network disturbance in the form of jitter.

As before, the first graph 501 shows the difference between the positive (LINE+) and negative (LINE−) lines of the network signal line 102 thereby providing a representation of the Differential Manchester Encoded signal from the network. Thus, the graph 501 may comprise the input of the receiver module 104 or the output of a comparator (which may form part of the receiver module) that determines the difference between the positive and negative lines of the bus. The output of the comparator or the receiver module 104, as mentioned, may comprise the input signal to the apparatus 210. Accordingly, the first graph 501 shows the input signal to the apparatus 210 as received at the input terminal 211. The input signal may comprises a two-level signal and thus comprises either a first voltage level (low or negative in this example) or a second voltage level (high and positive in this example), although other voltage levels will be present during the transitions between the first and second voltage levels, at least at the edges.

A second graph 502 shows a Return-to-Zero encoded signal that is generated by the example encoder 212. Thus, the second graph 502 shows an output signal of the encoder 212 that is provided at the output terminal 215.

A third graph 503 shows a decoded form of the Return-to-Zero encoded signal as would be received at the integrated physical layer module 225 or the Physical Medium Attachment sublayer 226. The third graph 503 therefore shows the output of the further apparatus 220.

In summary, the apparatus 210 is configured to generate a pulse having a length no shorter than a predetermined minimum time. If a logic one is present on the signal line 102, a second pulse needs to be generated but if a logic zero is present on the signal line 102, no second pulse is generated. The apparatus 210 is configured to generate or not generate the second pulse based on a sampling of the input signal and not on the detection of the edge 416 as in the example of FIG. 4. This has been found, in one or more examples, to provide an improved Return-to-zero encoded signal, which can be generated and/or decoded more effectively and wherein the decoded signal at the integrated physical layer module 225 conforms to maximum permitted jitter constraints.

Thus, in this and one or more other embodiments, the encoder 212 of FIG. 2 and with reference to the timing diagram of FIG. 5, is configured to detect a first edge 510 in the input signal, which occurs at time t1.

In response to the detection of the first edge 510, the encoder 212 is configured to provide a pulse generation sequence. Thus, rather than synchronously providing a pulse based on a local clock synchronized to the signal from the network, the encoder 212 is configured to react asynchronously to the detection of the first edge 510. The pulse generation sequence is as follows.

The detection of the first edge 510 triggers the encoder to generate, in the output signal, a first pulse 511. The first pulse 511, which begins at time t1 (or shortly after time t1 accounting for processing time), comprises a first ramp portion in which the voltage level is changed from a first-pulse level to a second-pulse level, a first hold portion in which the second-pulse level is maintained, a second ramp portion in which the voltage level is changed from the second-pulse level to the first-pulse level and a second hold portion in which the second-pulse level is maintained. In this and one or more other examples, the first-pulse level comprises a low (voltage) level and the second-pulse level comprises a high (voltage) level. Accordingly, in the examples that follow the first-pulse level will be referred to as the low level and the second-pulse level will be referred to as a high level, for ease of understanding.

With reference to FIG. 5, the second ramp portion happens to begin at time t2 (although t2 actually marks a subsequent edge 512 in the input signal and therefore it should be noted that the beginning of the second ramp portion is unrelated to the time t2) and the first pulse is complete at time t3.

The consecutive first ramp portion and the first hold portion are provided at least over a first predetermined minimum time period. This minimum time period may be sufficient to allow for the circuitry of the encoder that generates the pulse to change the voltage and hold it for a time that is deemed sufficient for successful and reliable reception. In addition, the use of slower ramp portions may allow for improved EME performance.

Further, the second ramp portion and the second hold portion are provided at least over a second predetermined minimum time period. This second minimum time period may be sufficient to allow for the circuitry of the encoder that generates to the pulse to change the voltage and hold it for a time that is deemed sufficient for successful and reliable reception. In addition, the use of slower ramp portions may allow for improved EME performance.

Further, it will be noticed with reference to FIG. 5 that the input signal includes a subsequent edge 512, directly subsequent to the first edge 510 in the middle of a bit time 506 of the input signal 501. The encoder 212 is configured to provide the first pulse 510, for its predetermined minimum time periods, irrespective of the presence of the subsequent edge 510 in the input signal. Thus, the encoder may be considered to, in terms of the pulse generation sequence, ignore edges that occur within a bit time of the input signal, i.e. in the middle of bits 506, 507 and 508.

The detection of the first edge 510 also triggers the encoder 212 to sample the input signal. The result of the sampling is to obtain a first sample indicative of a voltage level of the input signal to which the input signal transitions following said detection of the first edge 510 and to store said first sample. Thus, if the first edge 510 comprises a low to high edge transition, then the first sample is indicative of the high voltage level of the input signal. Likewise, if the first edge 510 comprises a high to low edge transition, then the first sample is indicative of the low voltage level of the input signal. The capture of the first sample may be performed in a number of ways. In one or more examples, when an edge is detected, the direction of the transition is determined by observing a logic output of a comparator. A positive direction of the transition would be captured as high voltage level first sample and negative direction transition would be captured as low voltage level first sample. In a further example, the encoder may be configured wait a short predetermined time after the detection of the first edge 510 and then sample the voltage level of the input signal. The short predetermined time may be configured to provide enough time for the input signal to reach one of the first or second voltage levels following detection of the first edge 510. In other examples, plural samples may be taken in response to detection of the first edge 510 and when two or more of the most recently sampled samples are equal, it may be determined that the one of the first voltage level or second voltage level has been reached in the input signal and the first sample may be determined from the recently sampled samples.

The detection of the first edge 510 also triggers the encoder 212 to sample the input signal at a second time. The encoder 212 is configured to sample the input signal within a time window between the end of the first hold portion (which happens to be at time t2) and an end of the first pulse at time t3. Accordingly, the encoder 212 obtains the second sample that is indicative of a voltage level of the input signal and stores said second sample.

In other examples, the time window may be narrower. For example, the second sample of the input signal may be within a time window between half a bit time of the input signal after the detection of the first edge and the end of the first pulse. As will be familiar to those skilled in the art, the bit time is the time in the input signal in which a single bit is signalled. In the present example, the bit time is 80 ns and therefore the time window may be between 40 ns after the time t1 until time t3, which is indicative of the end of the first pulse. In other examples, the second sample is taken at, or up to 5 ns prior to, or up to 10 ns prior to, the end of the first pulse. In other examples, the second sample is taken at, or up to 10% of the bit time prior to the end of the first pulse, marked by t3. In a further example, the second sample is taken at time t3.

It will be appreciated that, in a Differential Manchester Encoded input signal, a change in voltage level in the input signal during a bit time 506 is indicative of a first logic level and no change in voltage level in the input signal during a bit time is indicative of a second logic level. Bit 506 comprises the first logic level, which in this case is logic one. Bits 507 and 508 do not include a change in voltage level in the input signal during a bit time and are therefore indicative of the second logic level.

Thus, the encoder 212 is configured to determine the logic state to signal, by virtue of generating a second pulse 513 or not generating a second pulse, based on the first sample and the second sample.

If the first sample and the second sample are indicative of different voltage levels, then it is indicative of the input signal having changed state during a bit time, despite the presence of jitter, and that the bit is a logic one (in this example). Accordingly, the encoder is configured to generate, in the output signal, the second pulse 513. The second pulse 513 has a similar form to the first pulse. Thus, the second pulse 513 comprises a first ramp portion in which the voltage level is increased from the low level to the high level, a first hold portion in which the high level is maintained, a second ramp portion in which the voltage level is decreased from the high level to the low level and a second hold portion in which the low level is maintained, that is up to time t4.

The first ramp portion of the second pulse 513 and the first hold portion of the second pulse are provided at least over a third predetermined minimum time period. This third minimum time period may be sufficient to allow for the circuitry of the encoder that generates to the pulse to change the voltage and hold it for a time that is deemed sufficient for successful and reliable reception.

The second ramp portion of the second pulse 513 and the second hold portion of the second pulse 513 are provided at least over a fourth predetermined minimum time period. This fourth minimum time period may be sufficient to allow for the circuitry of the encoder that generates to the pulse to change the voltage and hold it for a time that is deemed sufficient for successful and reliable reception.

In the present example, the first pulse 511 has the same minimum length as the second pulse 513 and therefore the sum of the first and second predetermined minimum time periods is equal to the sum of the third and fourth predetermined minimum time periods. However, in other examples, the minimum length of the second pulse may differ from the minimum length of the first pulse 510.

In the present example, the first pulse is substantially symmetrical in terms of its time high and time low. Thus, in one or more examples, the first predetermined minimum time period is substantially equal to the second predetermined minimum time period (accounting for timing variations that are inherently present). However, in other examples, the first pulse may not be symmetrical.

Likewise, in the present examples, the second pulse is substantially symmetrical in terms of its time high and time low. Thus, in one or more examples, the third predetermined minimum time period is substantially equal to the fourth predetermined minimum time period (accounting for timing variations that are inherently present). However, in other examples, the second pulse may not be symmetrical.

The second pulse ends at time t4. Thus, the pulse generation sequence is complete. The encoder 212 is configured then to detect the next edge in the input signal, which is second edge 514.

The first, second, third and fourth predetermined minimum time periods enforced by the encoder enable the encoder to avoid overly short pulses, such as 410 and 411, in the output signal 502. The first and second predetermined minimum time periods are adhered to irrespective of the occurrence of edge 512 midway through the bit. If the first pulse 511 is provided over the first and second predetermined minimum time periods and the edge 512 arrives later, then the encoder, in an alternative example, could be configured to generate the second pulse in response to edge 512, but in the present example, the outcome of the comparison of the first and second samples acts as the trigger.

The first, second, third and fourth predetermined minimum time periods may be selected to avoid problems, such as EME, with creating the pulses 511, 513, 516, 517, and may be at least 5 ns or at least 7 ns or at least 8 ns, for example. The values assigned for the first, second, third and fourth predetermined minimum time periods may be based on the maximum jitter allowed in the input signal 501. For example, with a worst-case jitter in the input signal as shown in FIG. 4 at 401, the pulses 410 and 411 have a width of 20 ns or a quarter of a bit time 506. Thus, the sum of the first and second predetermined minimum time periods may be greater than a quarter of the bit time. Likewise, the sum of the third and fourth predetermined minimum time periods may be greater than a quarter of the bit time of the input signal. In this example, that is greater than 20 ns.

If we consider an upper limit on the first, second, third and fourth predetermined minimum time periods, in one or more examples, the sum of the first and second predetermined minimum time periods may be equal to or less than half a bit time of the input signal. Likewise, the sum of the third and fourth predetermined minimum time periods may be equal to or less than half a bit time of the input signal. In this example, that is 40 ns. This will ensure the first and second pulses 511 and 513 are provided with the bit time of the input signal.

Thus, in one or more examples, the sum of the first and second predetermined minimum time periods may be between 5 ns (or 17 ns for example) and half a bit time of the input signal. Likewise, in one or more examples, the sum of the third and fourth predetermined minimum time periods may be between 5 ns (or 17 ns for example) and half a bit time of the input signal.

We now consider the bits 507 and 508 that show the show the second logic level.

The second edge 514, in this example, occurs at the same time t4 that the second pulse 513 completes. However, in other examples, these times may not be aligned.

In response to the detection of the second edge 514, the encoder 212 is configured to provide said pulse generation sequence. Accordingly, further first pulse 516 is generated which, like the first pulse 511 and second pulse 513, comprises a first ramp portion in which the voltage level is increased from a low level to a high level, a first hold portion in which the high level is maintained, a second ramp portion in which the voltage level is decreased from the high level to the low level and a second hold portion in which the low level is maintained. The first pulse therefore starts at time t4 or very shortly after accounting for processing delays and ends at time t6. Also, in this example, the first ramp portion and the first hold portion are provided at least over the first predetermined minimum time period. Further, in this example, the second ramp portion and the second hold portion are provided at least over the second predetermined minimum time period. Also, like the first pulse 511 the further first pulse 516 is provided irrespective of an edge subsequent the second edge 514 being present in the input signal. However, it will be appreciated that bits 507 and 508 do not include an edge in the middle of the bit times.

The detection of the second edge 514 also triggers the encoder 212 to sample the input signal. The result of the sampling is to obtain a further first sample indicative of a voltage level of the input signal to which the input signal transitions following said detection of the second edge 514 and store said further first sample. The further first sample will be indicative of the second voltage level.

The detection of the second edge 514 also triggers the encoder 212 to sample the input signal at a further second time. The encoder 212 is configured to sample the input signal within a time window between the end of the first hold portion at time t5 and an end of the first pulse at time t6. Accordingly, the encoder 212 obtains the further second sample that is indicative of a voltage level of the input signal and stores said further second sample. As described above in relation to the second sample, the time window in which the further second sample is taken may be narrower. The further second sample, for this bit 507, is indicative of the second voltage level.

Thus, the further first sample and the further second sample are indicative of the same voltage level.

The encoder is configured such that if the further first sample and the further second sample are indicative of the same voltage levels, then it is indicative of the input signal having not changed state during a bit time, despite the presence of jitter, and that the bit is a logic zero (in this example). It will be appreciated that bits 507 and 508 show the action of the encoder 212 in this instance. Accordingly, the encoder 212 is configured to maintain the voltage level in the output signal at the low level, that is between times t6 and t7 when considering the encoder acting over bit 507.

The encoder is configured to maintain the voltage level in the output signal at the low level from time t6 until the encoder detects the next edge 515.

Thus, the second pulse 513 is provided at least over a predetermined time period (the third predetermined minimum time period plus the fourth predetermined minimum time period) for indicating the first logic state in the input signal 501. However, the length of time for which the low level is maintained for indicating the second logic state is from a time following the end of the first pulse to a time at which the next edge is detected.

After that encoder has maintained the voltage level in the output signal at the low level, that is between times t6 and t7, the signalling of the second bit 507 is complete. Accordingly, the encoder 212 is configured to determine the occurrence of the next edge 515.

In response to the detection of the next or third edge 515, the encoder 212 is configured to provide said pulse generation sequence. Accordingly, still further first pulse 517 is generated which, like the first pulse 511 and second pulse 513, comprises a first ramp portion in which the voltage level is increased from a low level to a high level, a first hold portion in which the high level is maintained, a second ramp portion in which the voltage level is decreased from the high level to the low level and a second hold portion in which the low level is maintained. The first pulse therefore starts at time t7 or very shortly after accounting for processing delays and ends at time t8. Also, in this example, the first ramp portion and the first hold portion are provided at least over the first predetermined minimum time period. Further, in this example, the second ramp portion and the second hold portion are provided at least over the second predetermined minimum time period. Also, like the first pulse 511 the still further first pulse 517 is provided irrespective of an edge subsequent the third edge 515 being present in the input signal. However, it will be appreciated that bit 508 does not include an edge in the middle of the bit.

The detection of the third edge 515 also triggers the encoder 212 to sample the input signal. The result of the sampling is to obtain a still further first sample indicative of a voltage level of the input signal to which the input signal transitions following said detection of the second edge 514 and store said further first sample. The first sample will be indicative of the first (low) voltage level.

The detection of the third edge 515 also triggers the encoder 212 to sample the input signal at a still further second time. The encoder 212 is configured to sample the input signal within a time window between the end of the first hold portion and an end of the first pulse at time t8. Accordingly, the encoder 212 obtains the still further second sample that is indicative of a voltage level of the input signal and stores said second sample. The still further second sample, for this bit 508, is indicative of the first voltage level.

Thus, the still further first sample and the still further second sample are indicative of the same voltage level and thus, the encoder 212 is configured to maintain the voltage in the output signal at the low level until the next edge is detected at time t9.

In the examples above the first and second pulses 511, 513, 516, 517 are shown as positive polarity pulses and accordingly the high level is a high, positive voltage level and the low level is lower voltage than the high level and may be zero. However, more generally, the first and second pulses 511, 513, 516, 517 may be negative polarity pulses and accordingly the first-pulse level is a high negative voltage level, relative to said second-pulse level. In general, the first-pulse level signifies a reference level and the second-pulse level signifies a different voltage that represents the pulse.

The network or bus represented by the signal line 102 comprises an Ethernet network. However, in other examples, the same apparatus 210 may be applicable in other network types. Further, in this and one or more other examples, the apparatus 210 comprises part of a transceiver 101 for coupling to said Ethernet network. However, in other examples, the apparatus 210 may be separate from the transceiver 101 and may be configured to be located between the transceiver 101 and the digital PHY part 106. Thus, the apparatus 210 may couple to a RX pin 108 terminal of the transceiver to receive the input signal at the input terminal 211. Likewise, the output terminal of the apparatus may then couple to an RX input terminal of the digital PHY part 106. Further, the transceiver 101 of which the apparatus 210 may form part may comprises an Ethernet 10BASE-T1S transceiver.

If we consider the decoded signal shown at 503, we see that decoded signal at the input to the integrated physical layer module 225 or the Physical Medium Attachment sublayer 226 has now the properties that the minimum pulse width is 40 ns determined by the fixed high and low time of the output signal. The edges are shifted when required, but never for more than 20 ns (in this example). This results in a different jitter characteristic compared to the jitter on network 102 and in the input signal, but it still meets the requirement of a maximum jitter of 20 ns.

Figure 6:
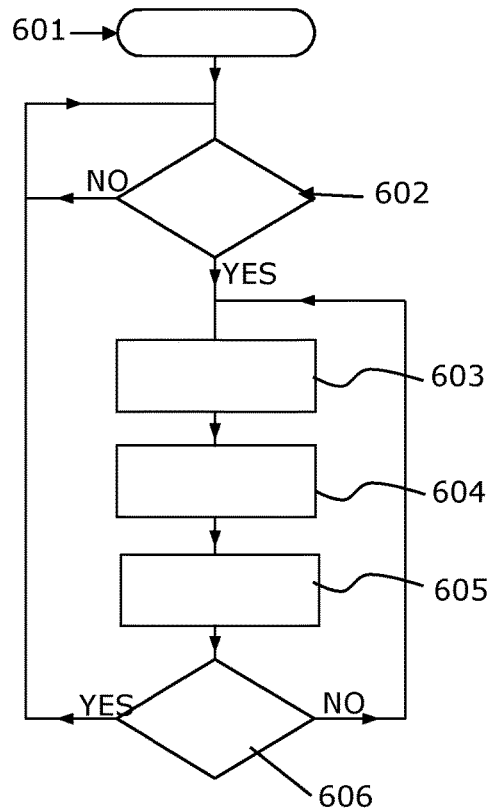
FIG. 6 shows a flow chart illustrating an example method.

FIG. 6 shows an example flow chart to show the action of the apparatus 210 and, in particular, the encoder 213.

Box 601 shows the start of the action of the encoder 212 in which is starts by looking for an edge in the input signal. Box 602 represents the encoder determining whether an edge has been detected. If the answer is NO, the method return to box 602. If the answer is YES, the method proceeds to box 603 in which the first sample is taken. Box 604 shows the generation of the first ramp portion and the first hold portion of the first pulse 511, 516, 517. Box 605 represents the generation of the second ramp portion and the second hold portion of the first pulse 511, 516, 517. Box 606 represent the encoder taking the second sample and determining whether the first sample and the second sample are the same. If the answer is YES, the method returns to box 602 and thus, by default, the low level in the output signal is maintained until the second edge 514. Otherwise, the method returns to box 603 followed by boxes 604 and 605, which generates the second pulse 513.

After the second pulse has completed at box 605, the method returns to box 602 (not shown). Such a return may be enforced, or the determination at box 606 may have the same effect because when box 603 is revisited after the first pulse 511, it will lead to taking of a "first sample" which will be at time t3. The "second sample" taken at 606 will be near or prior to t4 and the fact the samples are the same will automatically cause the method to move to box 602.

Figure 7:
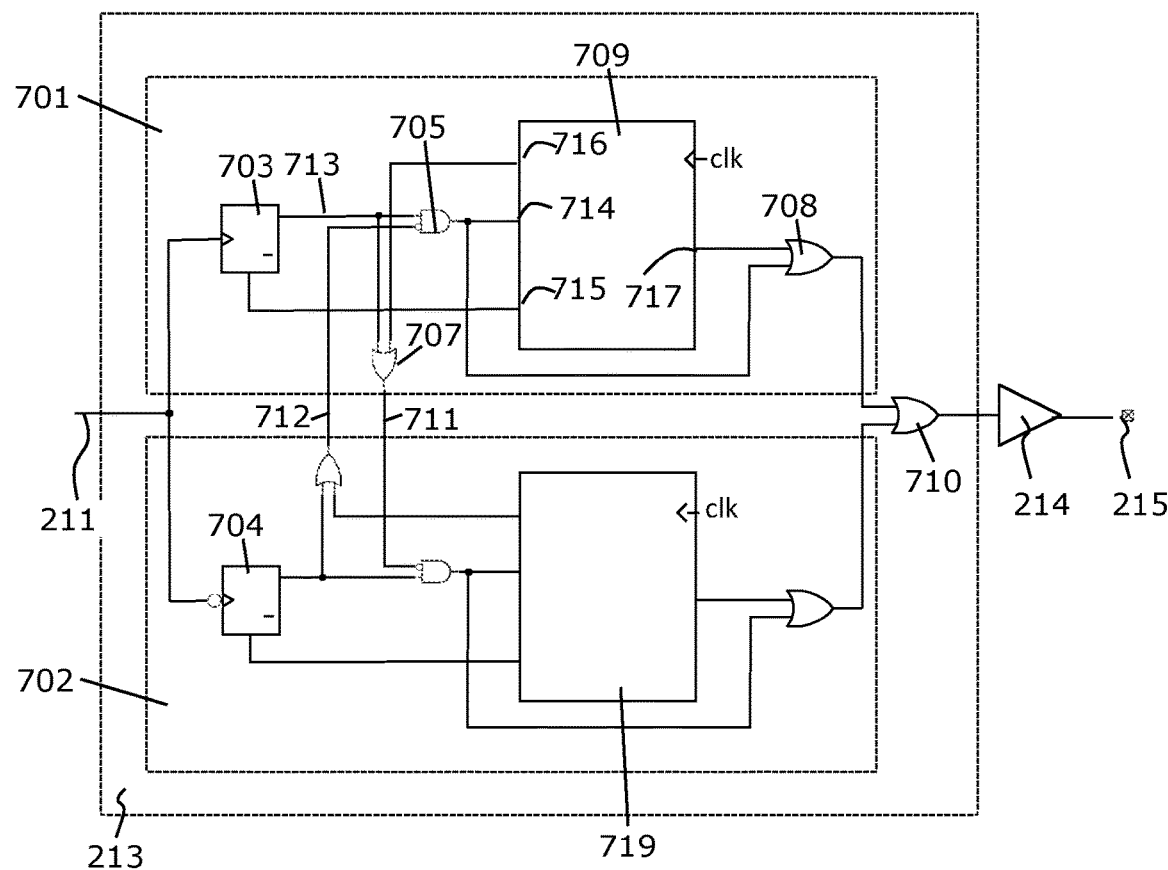
FIG. 7 shows an example digital implementation of the apparatus of example FIG. 2.

Example FIG. 7 shows a digital implementation of the apparatus 210 of example FIG. 2. Accordingly, FIG. 7 shows an example of the encoding logic module 213 and the amplifier 214, which couples to the output terminal 215 and on to the RX pin 108.

The embodiment of example FIG. 7 is implemented by a combination of flip-flops and logic gates. However, it will be appreciated that there are many other ways in which the encoder could be realised. For example, the encoder could alternatively comprise an edge detector, a voltage driver or pulse generator for generating the first and second pulses, a sampling circuit for taking the first sample and the second sample, and a comparator to compare the first and second samples and a timer to ensure the pulses are provided over the predetermined minimum times.

Nevertheless, returning to the example of FIG. 7, a digital implementation consisting of asynchronous and synchronous digital logic is shown. If the implementation would be fully synchronous, the sampling at the clock frequency would result in added jitter. Thus, providing an encoder that has a asynchronously operating part and a synchronously operating part may be advantageous to prevent any jitter being added to the encoding performed by the encoder, wherein the asynchronously operating part reacts to edges and starts the pulse generation sequence while the synchronous operating part is configured to define the pulse width of the first/second pulse, or parts thereof, based on an accurate clock.

The encoding may be provided by two similar pulse generators comprising a rising edge pulse generator 701 and a falling edge pulse generator 702. Thus, the rising edge pulse generator 701 is triggered by rising edges on the signal line 102 (as represented in the input signal) while the falling edge pulse generator 702 is triggered by falling edges.

The rising edges are detected by a first flipflop 703, while falling edges are detected by a second flipflop 704 due to a logic inverter at the input to the second flipflop 704 from branched input 211.

The behaviour of the rising edge pulse generator 701 will be explained and it will be appreciated that the falling edge pulse generator 702 behaves in the same way. The asynchronous logic part is provided by the first flipflop 703, a first AND gate 705, a first OR gate 707, and a second OR gate 708. The synchronous part is provided by the pulse Finite State Machine, FSM 709. The FSM 709 is explained with reference to FIG. 8 below.

The outputs of the rising and falling edge generators 701 and 703 are combined by a third OR gate 710 and the generated pulse is driven in the output signal via amplifier "driver" 214.

Initially, signals "block_rise" at 712 and "block_fall" at 711 that are exchanged between the generators 701 and 702 are logic low. A rising edge on the signal line 102 (LINE+, LINE−) triggers the first flipflop 703 via the comparator 104 and the "output Q" 713 of the first flipflop 703 becomes logic high. The output of the first AND gate 705 becomes logic high resulting in a high level on the output terminal 215 via the asynchronous path of the first AND gate 705, the second OR gate 708 and the third OR gate 710. At the same time the falling edge pulse generator 702 is blocked in being triggered because the output of the first OR gate 707 drives the "block_fall" signal logic high at 711. The pulse FSM 709 is triggered via a logic high at an "reqpulse input" 714, resulting in a change to a CLEAR state (explained below) and signals "clearcapt" at 715, "holdblock" at 716 and "drvhigh" at 717 become logic high. The first flipflop 703 is reset, and the output Q at 705 becomes logic low. Since the holdblock signal at 716 is now logic high, the falling edge pulse generator 702 is still blocked from being triggered by the "block_fall" signal at 711. The FSM 709 changes after one clock cycle to a "DRVHIGH" state in which "drvhigh" at 717 and the "clearcapt" signal at 715 becomes logic low and a timer is started counting a fixed value of clock transitions which determines how long the first pulse or the second pulse is driven high (first or third predetermined minimum time period). When the timer expires, the FSM 709 changes to a "DRVLOW" state and thus the "drvhigh" signal at 717 becomes logic low resulting in a low level on at the output terminal 215 via the second OR gate 708, the third OR gate 710 and the driver 214. Again, a timer is started counting a fixed value of clock transitions which determines how long the first pulse or second pulse is driven low (second or fourth predetermined minimum time period). When the timer expires the FSM 709 changes to a "WAIT" state and the "holdblock" signal at 716 becomes logic low, releasing the blocking of the falling edge pulse generator 702 by way of signal block_fall at 711.

The process is similar when a falling edge is detected in the input signal, but now the falling edge pulse generator 702 creates the return-to-zero pulse(s) in the output signal and the rising edge pulse generator 701 is blocked from being triggered via the block_rise signal at 712.

In one or more examples, if the time between edges detected in the input signal is longer than two times the FSM timer value, the return-to-zero pulse generation at the output terminal is triggered asynchronously because the block_fall and block_rise signals at 711 and 712 will be logic low.

In one or more examples, if the time between edges detected in the input signal is shorter than two times the FSM timer value, the return-to-zero pulse generation at the output terminal is triggered synchronously because the release (change from high to low) of the block_fall or block_rise signal at 711 and 712 will trigger the FSM 709 or 719 when an edge was detected before by flip flop 703 or 704.

In one or more examples, the advantage of using synchronous logic to generate the high and low times at the output terminal 215 is that the length is determined by a clock which can be trimmed to a high accuracy (e.g., +/−10%). Combining asynchronous logic with synchronous logic circumvents the problem of adding jitter due to time quantization of the synchronous logic.

Figure 8:
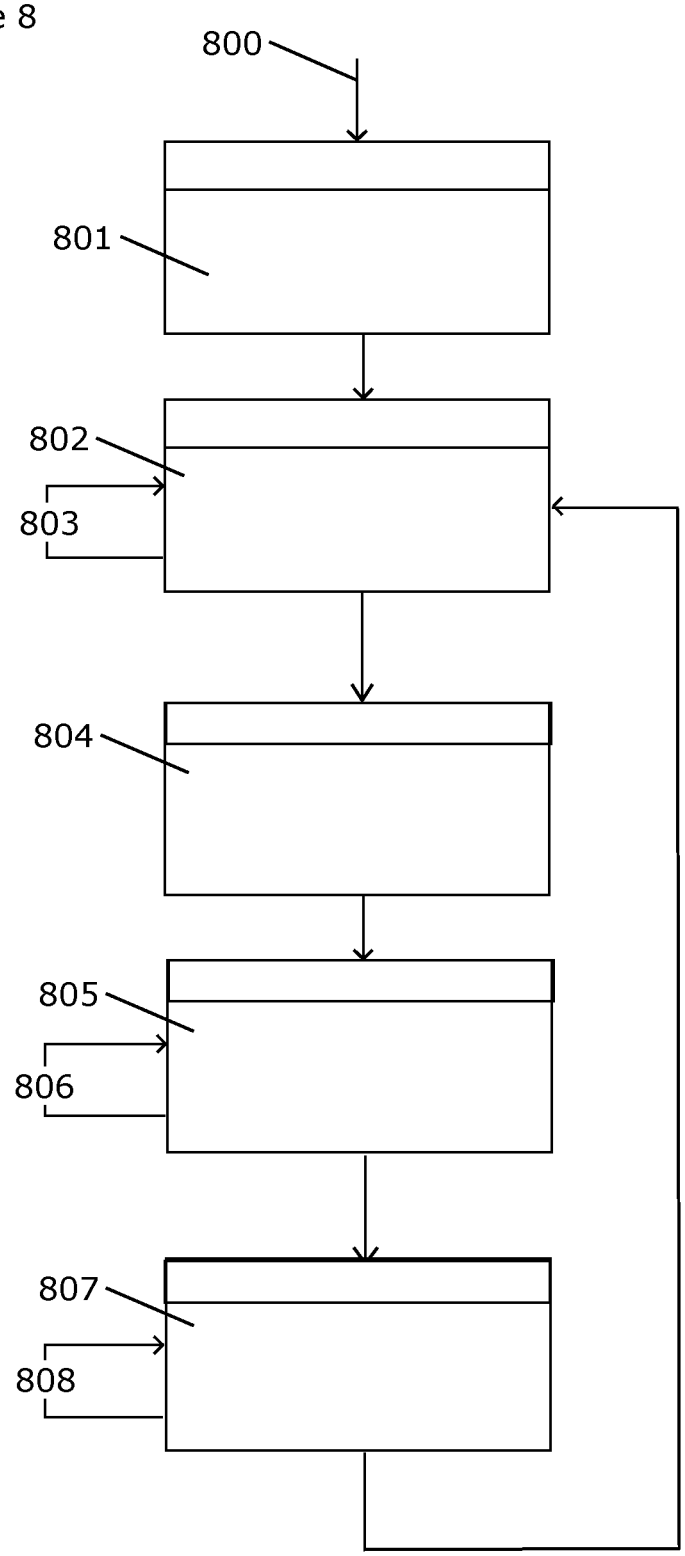
FIG. 8 shows an example flowchart illustrating an example method of a finite state machine of the example of FIG. 7.

FIG. 8 summarizes the states of the FSM 709 (or FSM 719). Power-on starts at 800 and block 801 comprises a RESET state. In block 801, clearcapt=1, holdblock=0 and drvhigh=0. Block 802 comprises a WAIT state that awaits the reqpulse signal going high from the first AND gate 705. In block 802, clearcapt=0, holdblock=0 and drvhigh=0. With reqpulse=0 a loop 803 occurs. With reqpulse=1, the FSM proceeds to block 804. Block 804 comprises a CLEAR state in which clearcapt=1, holdblock=1 and drvhigh=1. Block 805 shows a DRVHIGH state in which clearcapt=0, holdblock=1 and drvhigh=1. With the timer mentioned previously not expired, a loop 806 occurs. When the timer expires, the FSM moves to a state DRVLOW represented by block 807, which again loops 808 until the time expires. In state DRVLOW of block 807, clearcapt=0, holdblock=1 and drvhigh=0. When the timer expires, the FSM reverts to the RESET state 802.

In summary, the encoder embodiment of FIG. 7 comprises a first flip-flop based module 701 configured to detect rising edges in said input signal and a second flip-flop based module 702 configured to detect falling edges in said input signal, wherein in response to detection of either of a rising edge or a falling edge, one of the respective first and second flip-flop modules is configured to provide for said pulse generation sequence based on a sequence of signalling provided by a pre-programmed finite state machine and, while said pulse generation sequence is ongoing, provide a signal (block_fall or block_rise) to the other of the first and second flip-flop based modules to inhibit initiation of a further pulse generation sequence.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus comprising:
an input terminal for receiving an input signal indicative of signalling from a network, the input signal comprising at least a two level signal that comprises either a first voltage level or a second voltage level, an encoder configured to encode the input signal into an output signal and an output terminal for outputting the output signal, wherein the encoder is configured to:
detect a first edge in the input signal;
in response to the detection of the first edge provide a pulse generation sequence comprising the encoder being configured to:
generate, in the output signal, a first pulse, the first pulse comprising a first ramp portion in which the voltage level is changed from a first-pulse level to a second-pulse level, a first hold portion in which the second-pulse level is maintained, a second ramp portion in which the voltage level is changed from the second-pulse level to the first-pulse level and a second hold portion in which the first-pulse level is maintained, and wherein the first ramp portion and the first hold portion are provided at least over a first predetermined minimum time period and wherein the second ramp portion and the second hold portion are provided at least over a second predetermined minimum time period, and wherein the first pulse is provided over the first and second minimum time periods irrespective of an edge subsequent the first edge being present in the input signal; and
sample the input signal to obtain a first sample indicative of a voltage level of the input signal to which the input signal transitions following said detection of the first edge and store said first sample; and
sample the input signal a second time within a time window between the end of the first hold portion and an end of the first pulse to obtain a second sample indicative of a voltage level of the input signal and store said second sample; and
if the first sample and the second sample are indicative of different voltage levels, then the encoder is configured to generate, in the output signal, a second pulse, the second pulse comprising a first ramp portion in which the voltage level is changed from the first-pulse level to the second-pulse level, a first hold portion in which the second-pulse level is maintained, a second ramp portion in which the voltage level is changed from the second-pulse level to the first-pulse level and a second hold portion in which the first-pulse level is maintained, and wherein the first ramp portion and the first hold portion are provided at least over a third predetermined minimum time period and wherein the second ramp portion and the second hold portion are provided at least over a fourth predetermined minimum time period; or
if the first sample and the second sample are indicative of the same voltage levels, then the encoder is configured to maintain the voltage level in the output signal at the first-pulse level.

2. The apparatus of claim 1, wherein the input signal is encoded with Differential Manchester Encoding.

3. The apparatus of claim 1, wherein the encoder is configured to maintain the voltage level in the output signal at the first-pulse level in response to the first sample and the second sample being indicative of the same voltage levels, until the encoder detects a second edge in the input signal.

4. The apparatus of claim 1, wherein the encoder is configured to detect a second edge in the input signal that follows said second pulse or that follows the maintenance of the voltage level in the output signal at the first-pulse level; and
in response to the detection of the second edge, provide said pulse generation sequence.

5. The apparatus of claim 1, wherein the sum of the first and second predetermined minimum time periods is equal to the sum of the third and fourth predetermined minimum time periods.

6. The apparatus of claim 1, wherein:
the first predetermined minimum time period is equal to the second predetermined minimum time period.

7. The apparatus of claim 1, wherein:
the third predetermined minimum time period is equal to the fourth predetermined minimum time period.

8. The apparatus of claim 1, wherein:
the sum of the first and second predetermined minimum time periods is greater than a quarter of the bit time of the input signal.

9. The apparatus of claim 1, wherein:
the sum of the third and fourth predetermined minimum time periods is greater than a quarter of the bit time of the input signal.

10. The apparatus of claim 1, wherein the second sample of the input signal at the second time is within a time window between half a bit time of the input signal after the detection of the first edge and the end of the first pulse.

11. The apparatus of claim 1, wherein said network comprises an Ethernet network and said apparatus comprises part of a transceiver for coupling to said Ethernet network.

12. The apparatus of claim 11, wherein the transceiver comprises an Ethernet 10BASE-T1S transceiver.

13. The apparatus of claim 1, wherein the encoder comprises a first flipflop configured to detect rising edges in said input signal and a second flipflop configured to detect falling edges in said input signal, wherein in response to detection of either of a rising edge or a falling edge, one of the respective first and second flipflops is configured to provide for initiation of said pulse generation sequence and, while said pulse generation sequence is ongoing, provide a signal to the other of the first and second flipflop modules to inhibit initiation of a further pulse generation sequence.

14. The apparatus of claim 13, wherein the pulse generation sequence is provided by a predetermined sequence of signalling output by a respective finite state machine which is configured to be triggered by a respective one of said first flipflop and said second flipflop.

15. The apparatus of claim 1, wherein the sum of the first and second predetermined minimum time periods is equal to or less than half a bit time of the input signal.

16. The apparatus of claim 1, wherein the sum of the third and fourth predetermined minimum time periods is equal to or less than half a bit time of the input signal.

17. The apparatus of claim 1, wherein the sum of the first and second predetermined minimum time periods is greater than 16 ns.

18. The apparatus of claim 1, wherein the sum of the third and fourth predetermined minimum time periods is greater than 16 ns.

19. A combination of a transceiver that includes the apparatus of claim 1 and a microcontroller, wherein the transceiver is configured to couple to a network to receive differential signalling from the network and generate an input signal comprising a difference between the parts of the differential signalling, wherein the transceiver receives the input signal and generates the output signal, wherein said microcontroller is configured to receive said output signal and includes a decoder configured to decode the output signal to provide a bitstream for an Ethernet physical layer module of the microcontroller indicative of the voltage levels in the input signal.

20. A method for encoding an input signal into an output signal, wherein the input signal is indicative of signalling from a network and comprises at least a two-level signal that comprises either a first voltage level or a second voltage level, the method comprising, by an encoder:
   detecting a first edge in the input signal;
   In response to the detection of the first edge providing a pulse generation sequence comprising:
      generating, in the output signal, a first pulse, the first pulse comprising a first ramp portion in which the voltage level is changed from a first-pulse level to a second-pulse level, a first hold portion in which the second-pulse level is maintained, a second ramp portion in which the voltage level is changed from the second-pulse level to the first-pulse level and a second hold portion in which the first-pulse level is maintained, and wherein the first ramp portion and the first hold portion are provided at least over a first predetermined minimum time period and wherein the second ramp portion and the second hold portion are provided at least over a second predetermined minimum time period, and wherein the first pulse is provided over the first and second minimum time periods irrespective of an edge subsequent the first edge being present in the input signal; and
   sampling the input signal to obtain a first sample indicative of a voltage level of the input signal to which the input signal transitions following said detection of the first edge and store said first sample; and
   sampling the input signal a second time within a time window between the end of the first hold portion and an end of the first pulse to obtain a second sample indicative of a voltage level of the input signal and store said second sample; and
   if the first sample and the second sample are indicative of different voltage levels, then generating, in the output signal, a second pulse, the second pulse comprising a first ramp portion in which the voltage level is changed from the first-pulse level to the second-pulse level, a first hold portion in which the second-pulse level is maintained, a second ramp portion in which the voltage level is changed from the second-pulse level to the first-pulse level and a second hold portion in which the first-pulse level is maintained, and wherein the first ramp portion and the first hold portion are provided at least over a third predetermined minimum time period and wherein the second ramp portion and the second hold portion are provided at least over a fourth predetermined minimum time period; or
   if the first sample and the second sample are indicative of the same voltage levels, then maintaining the voltage level in the output signal at the first-pulse level.

* * * * *